United States Patent [19]

Svendsen et al.

[11] Patent Number: 5,681,441
[45] Date of Patent: Oct. 28, 1997

[54] METHOD FOR ELECTROPLATING A SUBSTRATE CONTAINING AN ELECTROPLATEABLE PATTERN

[75] Inventors: Leo Gulvad Svendsen, Redwood City; Clifford James Walker, Fremont; James Leborn Lykins, II, San Jose, all of Calif.

[73] Assignee: ELF Technologies, Inc., Foster City, Calif.

[21] Appl. No.: 994,687

[22] Filed: Dec. 22, 1992

[51] Int. Cl.$^6$ ..................................... C25D 5/02
[52] U.S. Cl. .................. 205/114; 205/125; 205/126; 205/136
[58] Field of Search ..................... 205/114, 115, 205/125, 126, 136

[56] References Cited

U.S. PATENT DOCUMENTS

| | | | |
|---|---|---|---|
| 2,600,343 | 6/1952 | Tuttle | 430/315 |
| 3,053,929 | 9/1962 | Friedman | 174/251 |
| 3,080,270 | 3/1963 | Lorenz | 156/233 |
| 3,099,608 | 7/1963 | Radovsky et al. | 205/123 |
| 3,167,450 | 1/1965 | Friedman | 428/368 |
| 3,167,490 | 1/1965 | Friedman | 205/161 X |
| 3,194,681 | 7/1965 | Nicholson | 427/601 |
| 3,347,724 | 10/1967 | Schneble, Jr. et al. | 156/151 |
| 3,385,773 | 5/1968 | Frantzen | 205/125 |
| 3,523,875 | 8/1970 | Minklei | 205/184 |
| 3,582,479 | 6/1971 | Urban et al. | 205/103 |
| 3,625,758 | 12/1971 | Krefeld et al. | 428/206 |
| 3,634,205 | 1/1972 | Melillo et al. | 205/150 |
| 3,769,179 | 10/1973 | Durose et al. | 205/99 |
| 3,812,020 | 5/1974 | Vander Mey | 205/50 |
| 3,854,973 | 12/1974 | Mersereau et al. | 428/413 |
| 3,880,689 | 4/1975 | Rolker et al. | 156/233 |
| 3,954,570 | 5/1976 | Shirk et al. | 205/118 |
| 3,988,216 | 10/1976 | Austin et al. | 205/87 |
| 4,131,516 | 12/1978 | Bakos et al. | 29/832 |
| 4,169,770 | 10/1979 | Cooke et al. | 205/139 |
| 4,217,182 | 8/1980 | Cross | 174/250 |
| 4,368,281 | 1/1983 | Brummett et al. | 523/458 |
| 4,518,465 | 5/1985 | Morimoto | 205/150 |
| 4,548,682 | 10/1985 | Yoshida | 205/119 |
| 4,681,665 | 7/1987 | Guillermet et al. | 205/147 X |
| 4,683,036 | 7/1987 | Morrisey et al. | 205/125 |
| 4,790,912 | 12/1988 | Holtzman et al. | 427/97 |
| 4,808,273 | 2/1989 | Hua et al. | 205/123 |

(List continued on next page.)

FOREIGN PATENT DOCUMENTS

| | | | |
|---|---|---|---|
| 258452 | 3/1988 | European Pat. Off. . | |
| 60-263606 | 12/1985 | Japan | B23B 47/18 |
| 60-263607 | 12/1985 | Japan | B23B 51/02 |
| 1-265405 | 10/1989 | Japan | H01B 1/22 |
| 2-33995 | 2/1990 | Japan | H05K 3/24 |

OTHER PUBLICATIONS

"Thin Film Electroplated Funnel Through–Holes on Polyamide Resin and Laminated Boards" by R.E. Hicks in Solid State Technology, vol. 16, No. 7, Jul. 1973, pp. 36–40.

*Primary Examiner*—Kathryn L. Gorgos
*Assistant Examiner*—William T. Leader
*Attorney, Agent, or Firm*—Fish & Richardson PC

[57] ABSTRACT

A method for the electroplating of conductive metal onto a substrate containing at least one hole and an electroplateable surface which is conducive to subsequent metal deposition comprises placing the substrate in close proximity to an electrode but such that there is no substantial electrical continuity between the electroplateable surface and the electrode prior to electroplating. The electroplateable surface is preferably an electroplateable pattern which comprises either a conductive metal pattern or a catalytic pattern for subsequent plating. This process can be employed with any electroplateable pattern technique which is recognized in the art such as, for example, printing, stamping, plating, photographic or electrophotographic processes. In one embodiment, this process can be employed in the production of Plated Wire, i.e., a product which can be effectively employed as a replacement for drawn wires in power distribution applications.

18 Claims, 3 Drawing Sheets

U.S. PATENT DOCUMENTS

| | | | |
|---|---|---|---|
| 4,810,333 | 3/1989 | Gulla et al. | 205/125 |
| 4,876,177 | 10/1989 | Akahoshi et al. | 430/313 |
| 4,900,618 | 2/1990 | O'Connor et al. | 428/328 |
| 4,915,796 | 4/1990 | Denofrio | 205/99 |
| 4,919,768 | 4/1990 | Bladon | 205/125 |
| 4,933,010 | 6/1990 | Okabayashi | 106/1.11 |
| 4,964,947 | 10/1990 | Yarita et al. | 216/18 |
| 5,007,990 | 4/1991 | Bladon | 205/126 |
| 5,013,402 | 5/1991 | Yarita et al. | 216/18 |
| 5,020,219 | 6/1991 | Leedy | 29/846 |
| 5,071,517 | 12/1991 | Oabayashi | 305/158 |
| 5,082,734 | 1/1992 | Vaughn | 428/411.1 |
| 5,092,958 | 3/1992 | Yarita et al. | 216/18 |
| 5,092,967 | 3/1992 | Guess | 205/126 |

METHOD FOR ELECTROPLATING A SUBSTRATE CONTAINING AN ELECTROPLATEABLE PATTERN

BACKGROUND OF THE INVENTION (A) Field of the Invention

The present invention relates to a method for the electroplating of a conductive metal onto a substrate containing at least one hole. In one embodiment, this method is employed in the production of a plated product which is capable of replacing conventional drawn copper wires such as those employed, e.g., in wire harnesses.

(B) Electroplating of Porous Substrates

The electroplating of a foraminous or porous supporting substrate, such as a woven fabric, for the production of a printed circuit has been recognized in the art. See, for example, U.S. Pat. Nos. 3,053,929 and 3,167,490 to Friedman which are incorporated by reference.

However, these processes both illustrate the art recognized belief that initial electrical contact, i.e., prior to electroplating, between the cathode surface and the surface to be plated is required. Moreover, a variety of techniques, for example, the process in U.S. Pat. No. 3,053,929 utilizes a specially designed cathode having a raised area which area conforms to the desired conductive pattern, to provide this contact.

It is an object of the present invention to provide an electroplating process which does not suffer from the foregoing limitations.

It is a further object of the present invention to provide an improved electroplating process which is capable of being employed in a variety of environments.

These and further objects will become apparent from the specification and claims which follow.

SUMMARY OF THE INVENTION

Among other factors, the present invention is based upon the surprising discovery that an electroplateable substrate containing at least one hole can be effectively electroplated even if it is not in initial electrical continuity with the cathode, i.e., it is not in electrical contact prior to introduction into the electroplating solution.

In particular, the present invention relates to a method for the electroplating of a conductive metal onto a substrate having an electroplateable surface. This electroplateable surface can involve the entire surface of the substrate or a pattern thereon. Furthermore, the substrate includes at least one hole defined therein.

The electroplateable pattern of the present invention is a pattern which is conducive to subsequent metal deposition and can comprise conductive metals, catalytic materials for subsequent metal deposition and the like.

The substrate is placed in close proximity to the electrode, however, the electroplateable pattern is not in substantial initial electrical continuity therewith. A conductive metal can then be electroplated from, e.g., recognized electroplating solution onto the substrate so as to form the final product.

The process of the present invention can find utility when employed in combination with those pattern forming techniques which, on their own, are largely ineffective in producing a significant thickness of conductive metal onto a substrate. For example, this process can be employed with electroless plating processes and their replacement systems.

In one embodiment illustrating this aspect, this method is employed in the production of Plated Wire.

By "Plated Wire", we are referring to a product in which a conductive metal trace is deposited onto a dielectric substrate, which trace has physical properties, e.g., shape, and cross-sectional area, that allow the product to replace conventional drawn wires for power distribution applications.

In this embodiment an insulated substrate containing a plurality of holes and having a catalytic pattern thereon is preferably employed. This method further comprises depositing a conductive metal onto the catalytic pattern so to provide the electroplateable pattern.

The substrate is subsequently attached onto an electrode and a conductive metal, e.g., copper is electroplated from a solution onto the electroplateable pattern to a thickness of e.g., 50-250 microns.

In another aspect, the present invention relates to products, such as Plated Wire, produced by these above methods.

DETAILED DESCRIPTION OF THE PREFERRED EMBODIMENTS

Figure 1:
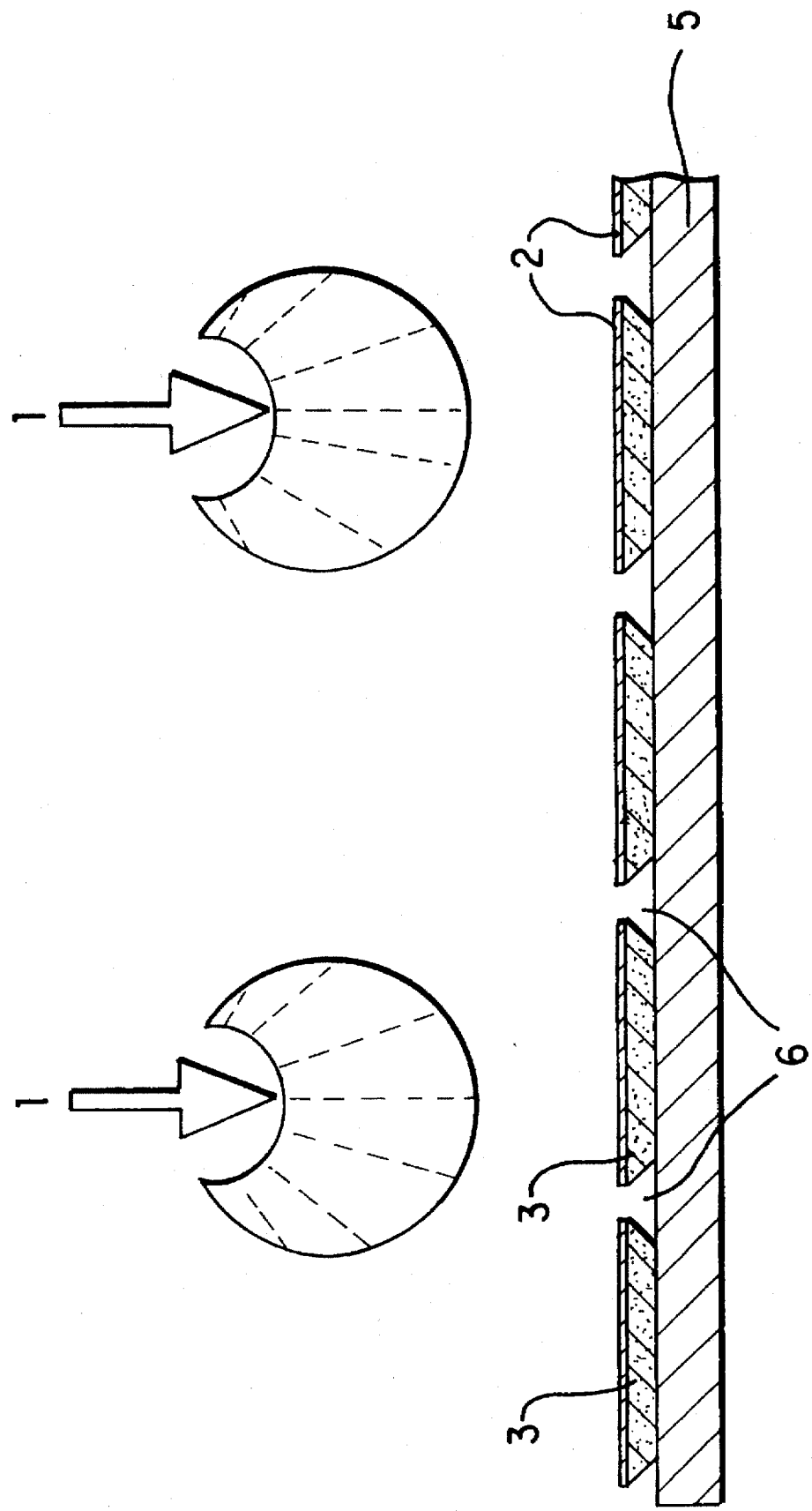
FIGS. 1-3 illustrate one method according to the present invention which is set forth in Example 6 to follow.

The present invention relates to a method for the deposition of a conductive metal onto a substrate which includes an improved electroplating technique and which can allow for the more effective and economical buildup of conductive metal onto the substrate.

This method employs a substrate having an electroplateable surface which can comprise the entire surface of the substrate or an electroplateable pattern (or trace). Moreover, this pattern can be random or predetermined. In either case, any suitable shape for the pattern can be employed, with the exact shape depending on the final product to be produced. Moreover, although the present invention will be discussed hereafter in terms of "pattern(s)", it also includes those situations where an entire surface of the substrate is electroplateable.

By "electroplateable", it is meant that the pattern is conducive to subsequent metal deposition by electroplating. Such patterns can comprise conductive metals, catalytic materials for subsequent metal deposition, and the like.

Electroplateable patterns may be introduced onto the substrate by a variety of means which are recognized in the art including, but not limited to, printing, e.g., screen printing and gravure printing; stamping, e.g., rubber stamping of inks; plating, e.g., electroless plating; photographic processes which include the activation of catalytic materials, and the precipitation or adhesion of a catalytic "ink"; and electrophotographic processes such as the deposition of liquid and/or dry toners.

In this regard, the choice of a particular technique would depend upon certain practical and economic considerations. That is, in view of the latitude that the present invention provides, it can be employed with virtually any existing pattern forming technology.

Combinations of the foregoing may also be employed. For example, after catalytic traces are introduced onto the substrate, the pattern may further be "pre-plated" with a conductive strike of electroless metal to act as a base layer for the electrolytic build up of the conductive metal. If the electroplateable pattern comprises solely catalytic methods, a first strike of an electrolytic bath may be advantageously employed prior to a "full" electrolytic build up of a conductive metal layer.

Suitable techniques for introducing the electroplateable patterns are recognized in the art and include (but are not limited to) those described in the following: U.S. Pat. No. 2,600,343 assigned to Kenyon Instrument Company; U.S. Pat. No. 3,080,270 assigned to Heberlein Patent Co.; U.S. Pat. No. 3,099,608 assigned to IBM; U.S. Pat. No. 3,625,758 assigned to Photocircuits CO.; U.S. Pat. No. 3,854,973 assigned to MacDermid Inc.; U.S. Pat. No. 3,880,689 assigned to Eastman Kodak Co.; U.S. Pat. No. 3,954,570 assigned to AMP Inc.; U.S. Pat. No. 4,217,182 assigned to Litton Systems, Inc.; U.S. Pat. No. 4,683,036 assigned to Photocircuits; U.S. Pat. No. 4,790,912, assigned to Schering; U.S. Pat. No. 4,810,333, assigned to Shipley Co.; U.S. Pat. No. 4,876,177, assigned to Hitachi; U.S. Pat. No. 4,892,798, assigned to Minnesota Mining and Manufacturing Co.; U.S. Pat. No. 4,900,618, assigned to Monsanto Co.; U.S. Pat. No. 4,933,010, assigned to Solution Technology Systems; U.S. Pat. No. 5,071,517, assigned to Solution Technology Systems; U.S. Pat. No. 5,082,734, assigned to Monsanto Co., each of which are incorporated by reference.

One particular area of technology to which the present invention may be employed is Plateable Toner Technology (PTT).

PTT is discussed for example in U.S. Pat. No. 4,504,529 to Sorensen et al, U.S. Pat. No. 4,495,216 to Sorensen et al, U.S. Pat. No. 4,518,738 to Sorensen et al, European Patent 0087135 to Sorensen et al, (which has a U.S. Patent family member in copending application Ser. No. 07/747,495) and copending application Ser. No. 07/834,055 to Svendsen et al, each of which are incorporated herein by reference for all purposes.

The composition of the substrate itself is not critical and clearly depends upon the nature of the final product.

Often, the substrate is a dielectric material with non-conductive materials being preferred in certain applications. However, as will become apparent from the following discussion, conductive substrates could be employed in the present invention.

The substrate employed in the present invention has at least one hole defined therein. The substrate can have more than one hole, in fact, a large number of holes can be located therein. In fact, a substrate fabric can be employed. Moreover, holes can be introduced either prior to, at the same time, or subsequent to formation of the electroplateable surface. These holes can be either placed selectively at particular points on the substrate, e.g., at particular points on the electroplateable pattern, or can be introduced generally across the substrate.

Furthermore, the apertures of the holes, i.e., the openings on either side may be the same or different sizes and shapes. The hole shapes can be of any geometry with round, oval and square being commonly employed. However, the number, arrangement, size and shape of the holes as well as any particular method of introduction are not critical to the invention.

It should also recognized that the above discussed features, i.e., number, range, size and shape of the holes as well as their method of introduction, can be selected so as to provide a degree of control over both the ultimate electroplating process and the final product. For example, the number, arrangement and size and shape of the holes affect effect the speed at which the electroplating process will occur.

The electroplateable substrate is placed in close proximity to the electrode, i.e., the cathode. However, in contrast to current electroplating processes, while the substrate is located in close proximity to the electrode, there is no need for initial electrical continuity between the electroplateable surface, e.g., pattern, and the electrode. That is, prior to introduction into the electroplating solution it is not necessary for electrical contact to exist.

It is our belief that the electroplating can be accomplished without any initial electrical contact between the pattern and the electrode due to a build up of electroplated metal in the hole(s) of the substrate. When the electroplated metal in the holes reaches the electroplateable pattern, electrical continuity is formed with the electroplateable pattern thus enabling subsequent electroplating of the electroplateable pattern.

Thus, by "close proximity", it is meant that the substrate is held near enough to the electrode subsequent electroplating in the hole(s) of the substrate will "grow" into electrical contact with the pattern or traces.

However, the invention is not in any way to be limited solely to this single primary mechanism for establishing electrical continuity. For example, other secondary mechanisms, e.g., contact caused byway of the electroplating solution, may also occur without going outside the scope of the present invention.

The substrate can be held in close proximity to the electrode by any technique which is effective in performing that function. In this regard, means for holding a substrate to an electrode are recognized in the art and thus need not be described in detail here. For example, where a dielectric substrate is employed, any method of holding the substrate to the electrode which does not itself establish substantial electrical contact between the electroplateable pattern and the electrode can be employed.

Examples of suitable techniques include the impingement with solution flow, e.g., of an electrolyte; gravity; and mechanical means such as spring tension means.

On the other hand, although conductive substrates can be employed, due to the conductive nature of the substrate, a technique for preventing substantial electrical contact between the electroplateable pattern and the electrode are also employed.

The substrate is then electroplated. In this regard any recognized electroplating solution can be effectively employed in the present invention. The solutions employed in the subsequent electroplating quite clearly depends on the final product to be produced with typical solutions including, but not limited to, Ni, Cu, Fe, and Sn solutions.

Furthermore, the present invention can be employed in conjunction with high-speed (or impingement) electroplating, which is recognized in the art and thus needs not be described in detail here.

As can be seen, the electroplating technique of the present invention can be employed with virtually any electroplateable surface and, thus, can find utility in a variety of environments.

One area in which it is envisioned that the electroplating technique of the present invention be employed is in combination with those pattern forming techniques which are ineffective in economically providing a significant thickness of conductive metal, e.g., greater than 10 microns, on a substrate.

One example of such a pattern forming technique is the electroless plating of metals such as Ni, Co, Ag, Pd, and Cu. However, it is clear that many of the previously discussed pattern forming techniques suffer from this deficiency and the present invention can be employed with any such technique.

In one specific example, the process of the present invention can be applied in the production of Plated Wire.

An insulator substrate is employed in this embodiment which substrate can include any of those dielectric materials which are recognized in the art. In the production of Plated Wire, preferred materials include polyethylene terephthalate, polyethylene naphthalate, epoxy, polyimide, polyether ether ketone, polyvinyl chloride, polypropylene, polytetrafluoroethylene and phenolic.

The holes can be introduced into the substrate by any suitable technique. For example, the substrate can be pierced by mechanical means such as needles, or laser boring of the substrate can be preformed.

The aspect ratio, i.e., the ratio of height to hole diameter, is selected so as to be conducive to electroplating in the hole. For example, should the ratio be too large, it would be unlikely that the electroplated metal would reach the electroplateable pattern. Accordingly, it is preferred that the ratio is not significantly greater than about 1.

In addition, the holes are between about 20 and 500 microns in diameter, more preferably between about 40 and about 500 microns.

Finally, the number of holes introduced into the substrate is selected so as to provide a uniform pattern upon electroplating. For example, the substrate can have one hole to about 0.1–10 cm$^2$.

In the production of Plated Wire, it is envisioned that those previously discussed pattern forming techniques could be employed. Preferred pattern forming techniques in this regard include printing, e.g., gravure and screen printing of catalytic inks, additive photographic methods and electrophotographic process employing liquid and dry toners such as PTT. Moreover, first strikes of either electroless copper or electrolytic copper which is formulated to disperse along the catalytic pattern can be employed.

The pattern can correspond to the shape(s) of the final Plated Wire product. Such a shape is not critical as long as it is effective in allowing the product to be employed in power distribution applications.

For example, a typical pattern is substantially longitudinal, i.e., would lie significantly along one axis of the substrate. Moreover, this pattern would comprise a relatively small number of conductive paths relative to its total surface area with the exact number of conductors depending upon its desired application. This pattern could have as few as one conductor or as many conductors as necessary to perform the desired power distribution function. Thus, although the pattern can include, e.g., a series of substantially parallel lines, the conductive pattern does not necessarily have to be straight, that is an "L" shaped pattern or the like can be employed. The conductive paths in this pattern can be, but are not necessarily, interconnected with each other.

As one specific example, the present invention can be easily and effectively employed with plateable toner technology. In the embodiments employing PTT, existing plateable toner particles are employed which particles preferably have a size of about 3 microns to about 40 microns with about 10 microns being more preferred.

In this process, a pattern of plateable toner is introduced, for example, by xerographic techniques such as laser printing, onto the substrate and the toner is fixed to the surface by any recognized technique, e.g., radiant fusing. The pattern is then electrolessly plated with copper. Subsequent to this initial deposition, the substrate is held in close proximity to the electrode and electroplated to form the final product which can be removed from the electrode. In this regard, the substrate can be attached to a flat or curved electrode or onto a drum which is introduced into, e.g., a turbulent plating solution.

In the production of Plated Wire, the electroplating solution can comprise recognized copper electroplating solutions such as those containing copper sulfate and copper fluoroborate. Such solutions are well recognized as commercially available and, they need not be described in detail here.

The amount of metal which is electroplated onto the substrate is dependent upon, e.g., the size and thickness of the tracings to be produced. For example, in most processes involving the production of Plated Wire, it is desired that the copper tracing have a relatively substantial thickness, e.g., about 50–250 µm, which allows for it to be employed in power distribution applications, for example, the carrying of current.

The process according to the present invention has numerous advantages over traditional electroplating processes. For example, as illustrated in the discussions relating to the production of Plated Wire, it eliminates the need for providing any relatively complex means for providing initial electrical contact, such as patterns which include "busses" in the plane of the electroplateable pattern or the special electrode arrangement of the Friedman patent. This arrangement further simplifies the process in as far as it eliminates any subsequent need to "debuss" the final product as well as any problems associated therewith.

The following examples illustrate the present invention as well as the advantages which can be associated therewith. These examples are understood to be illustrative and nowise limitive.

EXAMPLES

Example 1

A one square meter sheet of 125 µm thick polyester (polyethylene terephthalate) is uniformly sprayed on one side with a conductive varnish containing carbon black (the varnish is around 5 µm thick). The polyester surface is then pierced by a 400 µm diameter heated (300° C. setting) and numerically controlled needle. The pierced holes forms a triangular shaped pattern with each hole being 2 cm away from six other holes. The substrate is placed on top of a 0.5 mm brass foil and held in mild tension by polypropylene clamps, the side facing the brass foil is the side which has not been treated with conductive varnish. Therefore, the brass foil does not have any substantial electrical contact to the conductive top surface. Now, plating iron first at 1 A/dm$^2$ then after approximately 10 min. at 4.5 A/dm$^2$ onto the brass surface exposed in the pierced holes from a 400 g/l ferrous chloride bath (held at 90° C.) allows the iron to grow from the brass surface into the holes until it eventually reaches the surface and forms an electrical contact with the conductive varnish, electroplating occurs all over the surface of the conductive varnish, and a 50 µm thick layer of iron will build up all over the surface of the polyester sheet in another 45 min.

Example 2

A one square meter sheet of 75 µm thick polyimide is pierced with irregularly shaped holes by moving the sheet between two tungsten needles connected to a high voltage supply. The sheet is afterwards dipped in a water based catalytic solution containing Sn$^{2+}$ and Pd$^{2+}$. One side is, after dipping and cleaning of the surfaces, exposed to actinic light for 10 min. whereas the other side was kept unexposed. The exposed side will not plate in an electroless nickel-phosphorus bath whereas the unexposed side will, ten min. in the 95° C. electroless nickel bath will give a 2 μm thick nickel-phosphorus coating on the unexposed side. With a similar setup as in Example 1, the side coated with electroless nickel is facing away from the brass cathode, plating takes place in a nickel sulfonate electroplating bath (settings: 400 g/l of $Ni(SO_3NH_2)_2$ at 45° C. plating at 4.0 A/dm$^3$). In 30 min. a 25 μm nickel coating will be formed on the polyimide surface. Removing the sheet from the brass surface leaves the holes in the polyimide sheet empty of nickel because this adheres so well to the brass that the nickel protrusions formed in the holes remain on the brass sheet.

Example 3

A catalytic screen-printable ink is screened onto a sheet of 150 μm thick corona treated spun-bonded polyolefin. The ink sinks slightly into the surface of the substrate to due to its fibrous structure and when the ink heat cured afterwards it will bind tenaciously to the surface. The pattern is electrolessly plated in an electroless copper solution for 30 min. The patterned substrate is now placed with its backside on a 250 μm stainless steel sheet and immersed in a copper electroplating bath with 400 g/l of $Cu(BF_4)_2$ at 50° C. and 30 A/dm$^2$.

Electroplating will preferentially occur where the electrolessly plated pattern is located on the substrate. When the plating from the cathode reaches the electroless copper embedded in the substrate the electroplating process changes from mainly taking place inside the substrate fabric to taking place on the electrolessly plated pattern on the substrate surface. After peeling off the substrate from the cathode, the thin layer of copper on the back side of the substrate can easily be removed in 10% $H_2S_2O_8$ leaving a thick copper pattern semi-embedded in the substrate. The electroplating conditions exemplified herein are in the category of high speed or impingement plating, where the solution is mechanically moved at a high rate, (over 0.5 m/s), to facilitate plating rates over 20 A/dm$^2$.

Example 4

A one m$^2$ sheet of polyvinylchloride is repeatedly punched with a die 10 cm×10 cm having a matrix of needles. The polymer sheet is, after having been treated in this way, left with a matrix of holes 250 μm in diameter forming a triangular pattern with each hole being 1.5 mm away from six other holes. A pattern of plateable toner is now laser printed and fused on the sheet. The pattern of plateable toner is afterwards electrolessly plated with copper and then mounted on a drum made out of sheet of austenitic stainless steel with the electrolessly plated pattern facing away from the drum. The drum is set to spin at 15 revolutions/min. in a turbulent plating solution containing 240 g/l $CuSO_4.5H_2O$ kept at 40° C. Due to the construction of the plating cell and the stainless steel drum, plating can take place at 60 A/dm$^2$ which also leaves this experiment in the category of high speed or impingement plating. The plating will start out in all the holes and when in reaches the electrolessly deposited copper pattern it will preferentially enhance the pattern's thickness by 250 μm in 20 min. The copper in the holes not attached to any copper pattern is removed using an air jet after the substrate is lifted from the stainless steel drum. The copper filling the holes in the substrate under the pattern greatly improves the adhesion between the copper pattern and substrate acting as "roots" into the substrate.

Example 5

A pattern is off-set printed onto a 50 μm polyester substrate. The ink contains palladium atoms. After drying the ink in an oven the pattern is pierced by infrared light from a $CO_2$ laser. The hole pattern is laid out to compensate for the unevenness in thickness of the subsequent electroplating due to the differences in field densities from one area of the pattern to another. Areas with high field density, such as narrow lines, have few and small holes whereas wide areas have more and larger holes. The perforated substrate is placed on a stainless steel sheet and a commercially available copper electroplating solution is used to plate from the cathode, through the hole and gain contact with the catalytic surface. When this electroplating reaches the catalytic pattern it will preferentially plate on the catalytic pattern and form the base conductive deposit for the next step, which is to build up the thickness of the pattern by immersing it into a 200 g/l $CuSO_4.5H_2O$ plating solution held at room temperature while plating at 7 A/dm$^2$. This approach gives highly conductive copper patterns directly by electroplating. The substrate and the copper in the laser pierced holes comes off the electrode easily.

Example 6

Figure 2:
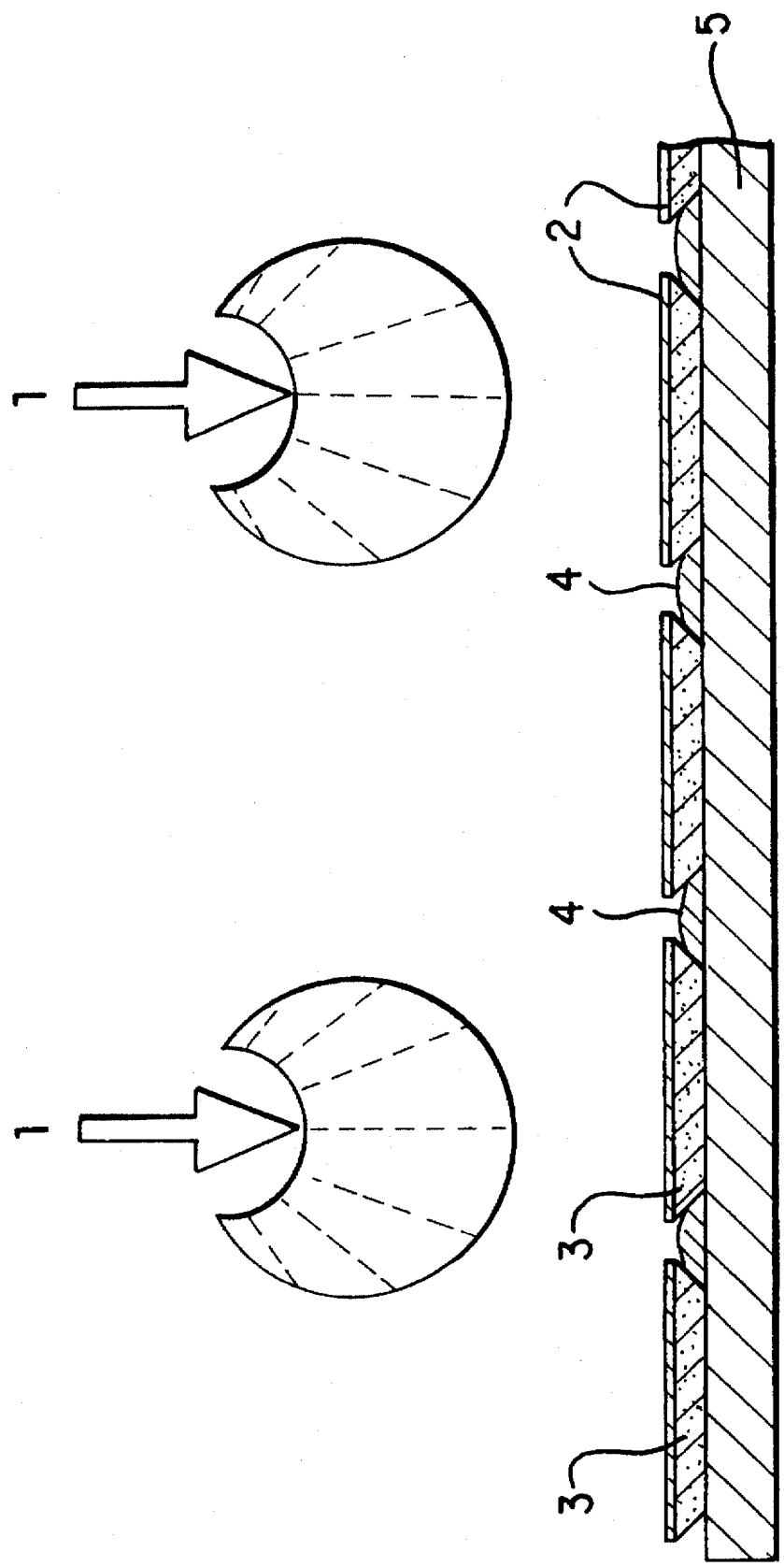
Figure 3:
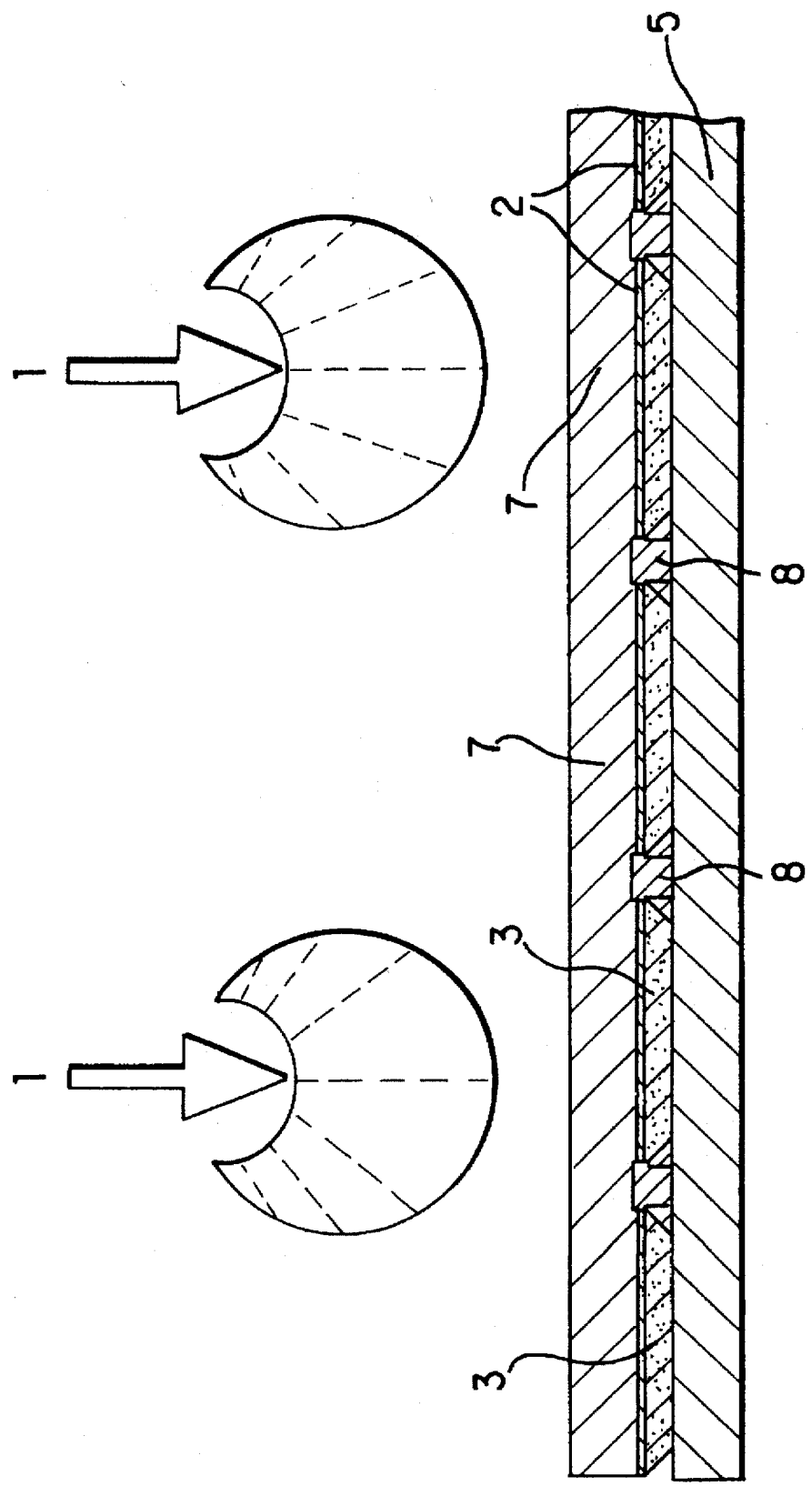

In this example, reference is made to FIGS. 1–3. A pattern was printed on 75 μm polyester substrate (3) by a laser printer charged with catalytic toner. The toner was fixed to the surface by radiant fusing. Holes (6) were now pierced through the toner and the substrate by means of a $CO_2$ laser. The hole size and frequency was put in to accommodate for the uneven electrical field due to the pattern, also some areas of the pattern had been filled out with a 100 μm line-space cross-hatch instead of the solid pattern used in most places. (Both the cross-hatching and the hole size and frequency influenced the thickness of the final product). One micrometer of electroless copper (2) was built up on the toned pattern whereupon the pierced substrate was attached to a stainless steel cathode (5) and plated in a turbulent plating solution containing 240 g/l of $CuSO_4.5H_2O$ kept at 40° C. (FIG. 1). Due to the Construction of the plating cell and the stainless steel cathode, plating could take place at 30 A/dm$^2$ which placed this experiment in the category of high speed plating illustrated by the impingement of plating solutions at (1). The plating (4) built up in the holes (FIG. 2) and when it reached the electrolessly deposited copper pattern, it plated on the pattern enhancing its plate thickness (illustrated at 7) by 250 μm±18 μm in 45 min. (FIG. 3). Laser drilled holes are typically conical having the largest aperture closest to the side of the incoming laser beam. The holes in the current example were drilled from the side opposite to the pattern, this resulted in a plating in the holes which "locked" the pattern to the substrate because the wide aperture opposite the pattern made any copper fillet wedge 8 in its respective hole.

While the invention has been described in terms of various preferred embodiments, the artisan will appreciate the various modifications, substitutions, omissions and changes may be made without departing from the spirit thereof. Accordingly, it is intended that the scope of the present invention be limited solely by the scope of the following claims including the equivalents thereof.

We claim:

1. A method for the deposition of a conductive metal onto a substrate comprising:
   (a) providing a substrate comprising a dielectric material and having an electroplateable pattern on a surface thereof; wherein said electroplateable pattern comprises a material which is conducive to the subsequent deposition of a preselected metal and at least one hole extends through both the substrate and the electroplateable pattern;
   (b) providing an electroplating environment including a cathode and an anode;
   (c) placing the substrate in close proximity to the cathode but such that there is no substantial electrical continuity between the electroplateable pattern and any electrode prior to electroplating; and
   (d) electroplating to (1) establish electrical continuity between the pattern and the cathode by way of at least one hole and (2) deposit metal directly on the surface of the electroplateable pattern so as to provide a final product.

2. The method according to claim 1 wherein the electroplateable pattern comprises a conductive metal pattern or a catalytic pattern for subsequent plating.

3. The method according to claim 2 wherein the electroplateable pattern comprises a conductive metal pattern.

4. The method according to claim 2 wherein the electroplateable pattern comprises a catalytic pattern.

5. The method according to claim 4 wherein the catalytic pattern is strike plated with an electrolessly deposited metal prior to (d).

6. The method according to claim 5 wherein the electrolessly deposited metal is selected from the group consisting of nickel, cobalt, silver, palladium, and copper.

7. The method according to claim 4 wherein the catalytic pattern is strike plated with an electrolytically deposited metal prior to (d).

8. The method according to claim 7 wherein the electrolytically deposited metal is copper.

9. The method according to claim 2 wherein the pattern is produced by printing, stamping, plating, photographic activation, photographic precipitation, photographic adhesion or electrophotographic deposition.

10. The method according to claim 2 wherein (d) comprises impingement electroplating.

11. The method according to claim 2 wherein the substrate includes a plurality of holes.

12. The method according to claim 11 wherein the holes are located across the substrate.

13. The method according to claim 11 wherein the holes are located within the electroplateable pattern.

14. The method according to claim 11 wherein the pattern is produced by electrophotographically depositing a plateable toner onto the substrate.

15. A method according to claim 14 wherein (a) further comprises the electroless deposition of a conductive metal from solution onto the pattern.

16. The method according to claim 15 wherein in (d) the pattern is electroplated with the copper to a thickness of about 50–250 μm.

17. The method according to claim 16 wherein the pattern has a shape which is substantially longitudinal and which includes at least one conductive path.

18. A method for the deposition of a conductive metal onto a component comprising:
   (a) providing a component consisting essentially of a dielectric substrate and an electroplateable pattern on a surface of the substrate, wherein said electroplateable pattern comprises a material that is conducive to the subsequent deposition of a preselected metal, and at least one hole extends through both the substrate and the electroplateable pattern;
   (b) providing an electroplating environment including a cathode and an anode;
   (c) placing the component in close proximity to the cathode but such that there is no substantial electrical continuity between the electroplateable pattern and any electrode prior to electroplating; and
   (d) electroplating to (1) establish electrical continuity between the pattern and the cathode by way of at least one hole and (2) deposit metal directly on the surface of the electroplateable pattern.

* * * * *